United States Patent [19]

Cohen

[11] Patent Number: 4,598,961

[45] Date of Patent: Jul. 8, 1986

[54] COAXIAL JACK CONNECTOR

[75] Inventor: Thomas S. Cohen, Camp Hill, Pa.

[73] Assignee: AMP Incorporated, Harrisburg, Pa.

[21] Appl. No.: 781,325

[22] Filed: Sep. 30, 1985

Related U.S. Application Data

[63] Continuation of Ser. No. 538,450, Oct. 3, 1983, abandoned.

[51] Int. Cl.[4] .................... H05K 1/00

[52] U.S. Cl. .................... 339/17 C; 339/177 R; 339/276 R

[58] Field of Search .................... 339/177 R, 177 E, 276 R, 339/17 R, 17 C, 17 LC

[56] References Cited

U.S. PATENT DOCUMENTS

| | | | |
|---|---|---|---|
| 2,869,090 | 1/1959 | Johanson | 339/17 R |
| 3,141,924 | 7/1964 | Forney | 339/276 R |
| 3,144,292 | 8/1964 | Forney | 339/276 R |
| 3,302,159 | 1/1967 | Schumacher | 339/276 R |
| 3,366,920 | 1/1968 | Laudig | 339/17 R |
| 3,383,457 | 5/1968 | Schumacher et al. | 174/68.5 |
| 3,743,748 | 7/1973 | Reeder | 174/75 C |
| 3,915,535 | 10/1975 | O'Keefe et al. | 339/17 C |
| 3,923,367 | 12/1975 | Carter | 339/276 R |
| 3,980,382 | 9/1976 | Reeder | 339/177 R |
| 4,003,617 | 1/1977 | Witek et al. | 339/17 C |
| 4,053,200 | 10/1977 | Pugner | 339/177 R |
| 4,060,887 | 12/1977 | De Groef | 29/626 |
| 4,135,776 | 1/1979 | Ailawadhi | 339/177 R |
| 4,360,244 | 11/1982 | Torney et al. | 339/177 R |
| 4,453,796 | 6/1984 | Monroe | 339/177 R |

*Primary Examiner*—Gil Weidenfeld
*Assistant Examiner*—David L. Pirlot

[57] ABSTRACT

A coaxial jack connector for electrical connection to signal and ground conductive paths of a printed circuit board comprises an outer metal body member having a substantially tubular section and a U-shaped section which includes terminal sections for electrical connection with the ground conductive path, a dielectric member having a section disposed along the outer body member, a center contact member is disposed in the dielectric member and has a contact section extending along an axis of the dielectric member and a terminal section extending outside the dielectric member between the terminal sections, an outer contact member extends along an outer surface of the dielectric member and engages the body member between the body member and the dielectric member, and a ferrule member is crimped onto the tubular section securing the outer contact member in the tubular section.

15 Claims, 3 Drawing Figures

COAXIAL JACK CONNECTOR

This application is a continuation of application Ser. No. 538,450, filed Oct. 3, 1983, now abandoned.

FIELD OF THE INVENTION

This invention relates to coaxial connectors and more particularly to coaxial jack connectors.

BACKGROUND OF THE INVENTION

A coaxial plug connector is disclosed in U.S. Pat. No. 4,412,717 of the SMB type which has spring contact members as part of the outer contact assembly. The plug connector is to be electrically connected with coaxial jack connectors that snap into electrical contact with a complementary outer contact thereof including those that are to be electrically connected to signal and ground conductive paths of a printed circuit board. Coaxial jack connectors of this PCB type are known, but they are expensive due to construction and cost of manufacture.

SUMMARY OF THE INVENTION

According to the present invention, a coaxial jack connector for electrical connection to signal and ground conductive paths of a printed circuit board comprises an outer metal body member having a substantially tubular section and a U-shaped section which includes terminal sections for electrical connection with the ground conductive path, a dielectric member having a section disposed along the outer body member, a center contact member is disposed in the dielectric member and has a contact section extending along an axis of the dielectric member and a terminal section extending outside the dielectric member between the terminal sections, an outer contact member extends along an outer surface of the dielectric member and engages the body member between the body member and the dielectric member, and a ferrule member is crimped onto the tubular section securing the outer contact member in the tubular section.

DETAILED DESCRIPTION OF THE INVENTION

Figure 1:
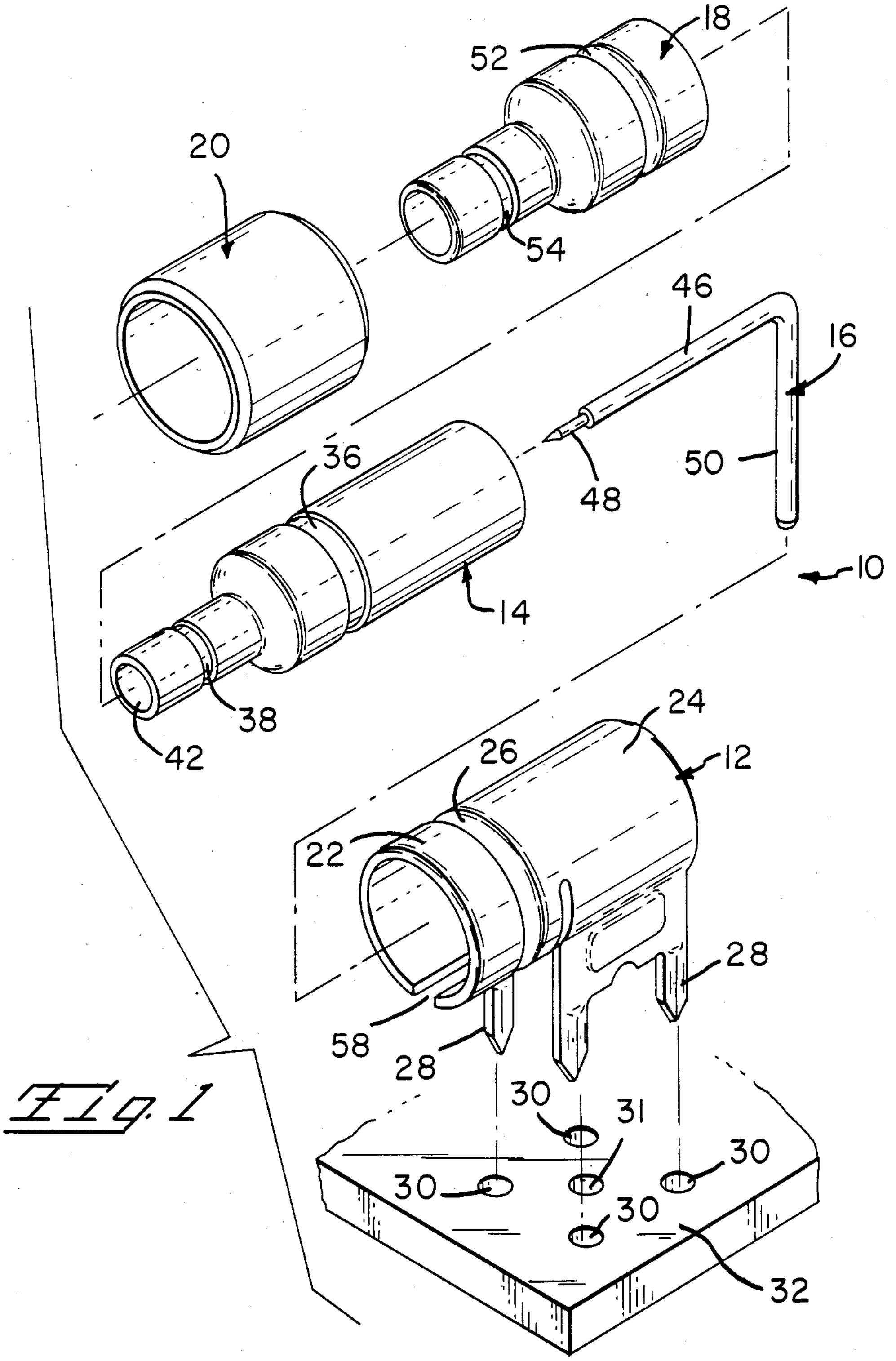
FIG. 1 is a perspective and exploded view of the components of the coaxial jack connector.
Figure 2:
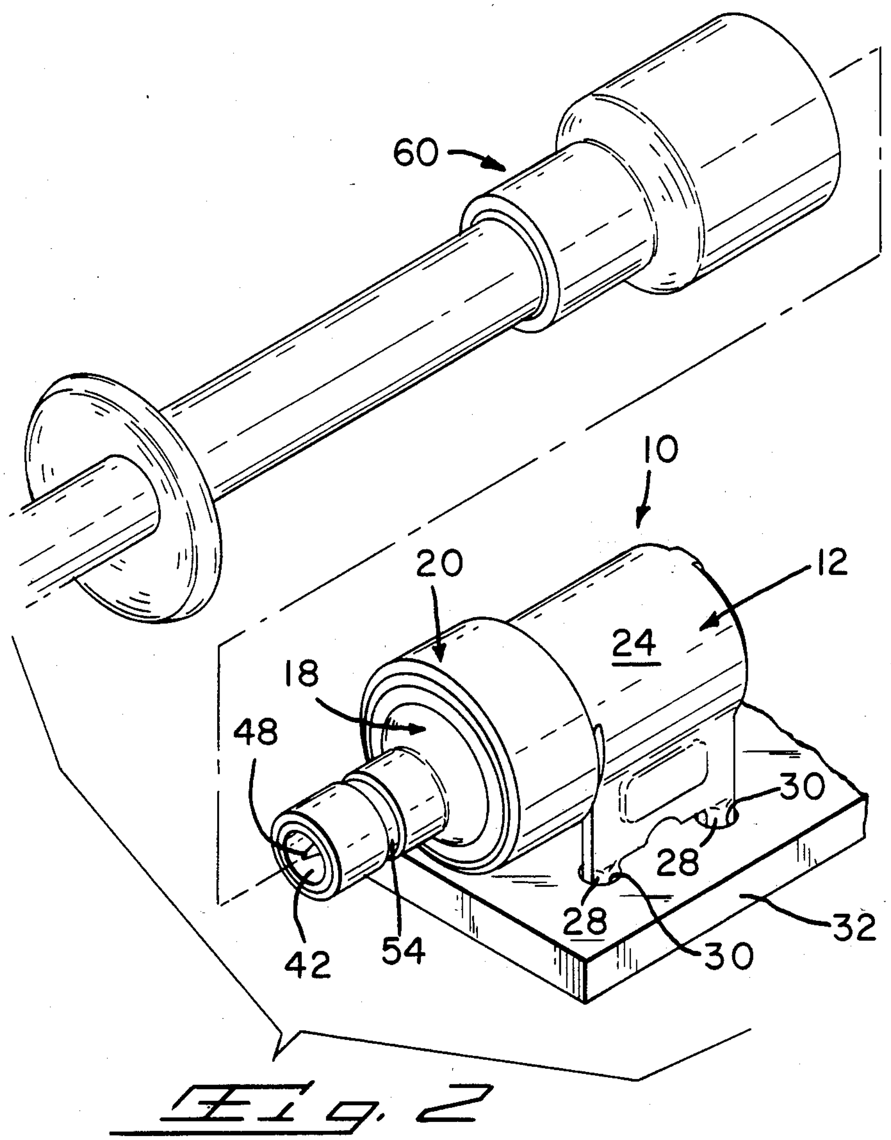
FIG. 2 is a perspective view of the coaxial jack connector in an assembled condition and a matable coaxial plug connector exploded therefrom.
Figure 3:
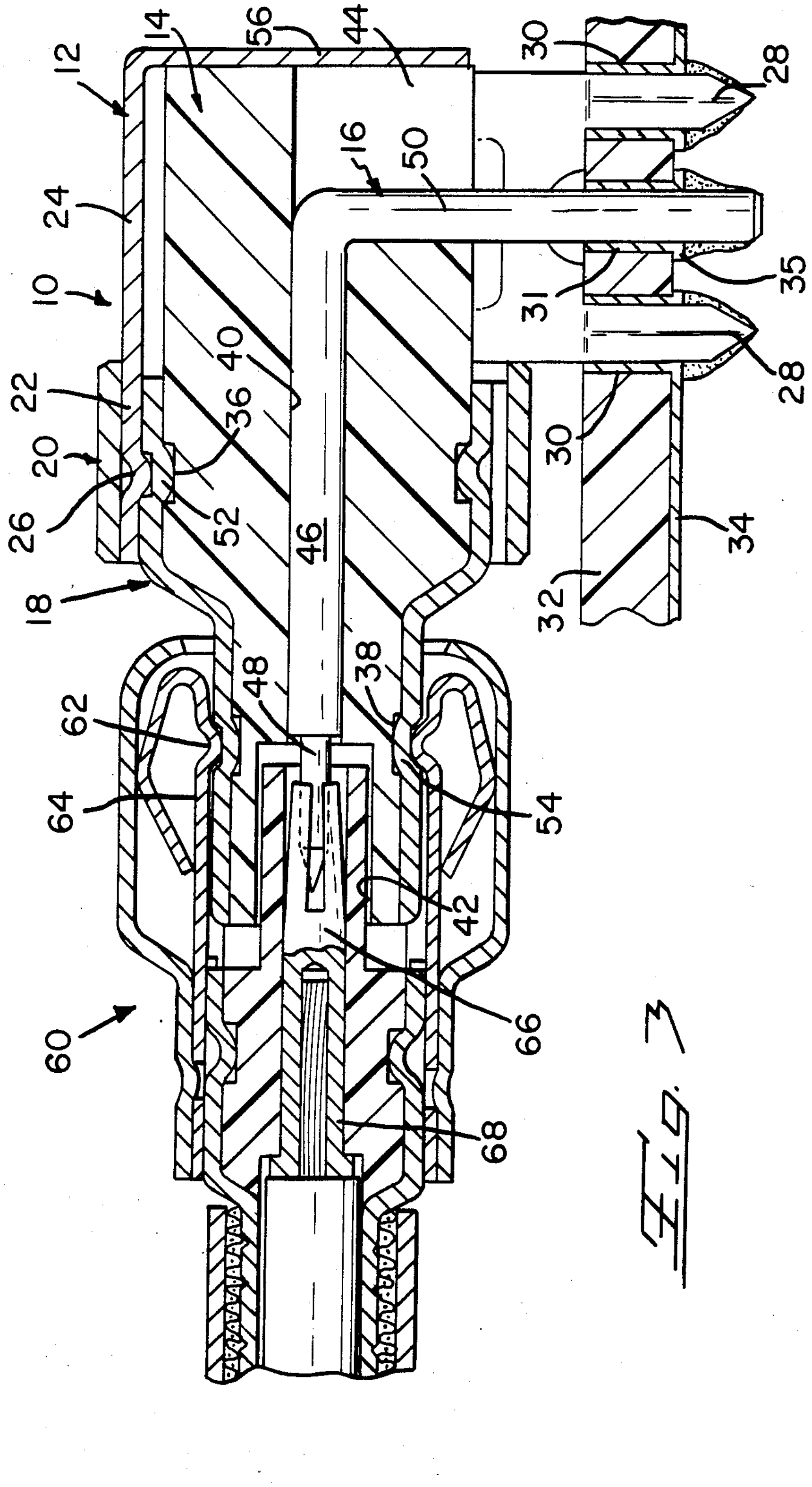
FIG. 3 is a cross section of the coaxial connectors in a mated condition.

Coaxial jack connector 10 as shown in FIGS. 1–3 includes a body member 12, a dielectric member 14, a center contact member 16, an outer contact member 18, and a ferrule member 20.

Metal body member 12 is stamped and formed from a suitable strip of metal having the desirable spring characteristics and includes a substantially tubular section 22 and a U-shaped section 24. An inwardly-directed projection 26 is located in tubular section 22 and U-shaped section 24 has terminal sections 28 that are disposable within holes 30 of printed circuit board 32 for soldered connection with a ground conductive path 34 as shown in FIG. 3.

Dielectric body member 14 is molded from a suitable plastic material and is of tubular configuration with annular grooves 36, 38 disposed therein. A bore 40 extends therethrough which communicates with a larger bore portion 42 at the front end of member 14 and a slot or opening 44 in the junction of the side and the rear end of the dielectric body member 14. Contact section 46 of center contact member 16 is disposed in bore 40 while contact element 48 is disposed in bore 42. Part of terminal section 50 of center contact member 16 is disposed in slot 44 of dielectric member 14 and the other part extends outwardly therefrom for disposition in hole 31 of printed circuit board 32 and soldered to a conductive signal path 35 as shown in FIG. 3.

Outer contact member 18 is a tubular member that fits onto dielectric member 14 and has inwardly-directed annular projections 52, 54 which are disposed in respective grooves 36, 38 thereby securing dielectric member 14 and outer contact member 18 together with center contact member 16 in dielectric member 14 as a center and outer contact assembly. This assembly is then inserted into metal body member 12 with terminal section 50 moving along opening or slot 58 in tubular section 22 until the rear end of dielectric member 14 engages a rear section 56 of body member 12 and inwardly-directed projection 26 is disposed in the groove formed by inwardly-directed projection 52 as shown in FIG. 3 thereby positioning the center and outer contact assembly of dielectric member 14, center contact member 16, and outer contact member 18 in position in body member 12. Ferrule member 20 is then positioned onto tubular section 22 and crimped in engagement therewith thereby securing the assembly in body member 12.

As shown in FIG. 3, coaxial plug connector 60 is electrically matable with further complementary coaxial jack connector 10 whereby arcuate sections 62 of outer spring contact members 64 are disposed in the annular groove formed by inwardly-directed annular projection 54 to make electrical connection between outer contact members of connectors 10 and 60 which also increases retention forces therebetween while contact element 48 of center contact member 16 is electrically connected with receptacle contact section 66 of center contact member 68 of connector 60.

As can be discerned, a right angle coaxial jack connector has been disclosed which is readily mounted onto and electrically connected to signal and ground conductive paths of a printed circuit board and is electrically matable with a coaxial plug connector.

I claim:

1. A coaxial connector, comprising a conductive body member formed with a U-shaped section having an open side, and formed with a tubular section having an opening in communication with the open side, and formed with conductive terminal sections projecting from the U-shaped section for connection to ground electrical potential, a dielectric body member in the U-shaped section and projecting through the tubular section and protruding from the conductive body member, a conductive center contact member projecting axially of the dielectric body member and through the tubular section for connection with a further electrical connector, a terminal section of the center contact member projecting from the dielectric body member and through the open side of the conductive body member for connection to a source of electrical signal, a conductive outer contact member encircling the protruding dielectric body member and extending into the tubular section, a conductive ferrule in crimped engagement on the tubular section and covering the opening of the tubular section, a dielectric opening in the junction of a side and an end of the dielectric body member and in communication with the bore in the dielectric body member, and the terminal section of the center contact member projecting from the dielectric opening and through the side of the dielectric body member.

2. A coaxial connector as recited in claim 1 wherein the conductive body member is formed with an end section engaging an end of the dielectric body member and covers a portion of the dielectric opening in the dielectric body member.

3. A coaxial connector as recited in claim 1 wherein the conductive body member is formed with an end section engaging an end of the dielectric body member.

4. A coaxial connector as recited in claim 1 wherein the tubular portion is a split tubular portion formed by the opening in the tubular portion.

5. A coaxial connector as recited in claim 1 wherein the tubular portion is a split tubular portion formed by the opening in the tubular portion.

6. A coaxial connector as recited in claim 1 wherein the exterior of the outer contact member is provided with a groove in which the tubular section is received.

7. A coaxial connector as recited in claim 6 wherein the ferrule encircles, respectively, the tubular section, the outer contact member, the dielectric body member and the center contact member.

8. A coaxial connector as recited in claim 6 wherein the conductive body member is formed with an end section engaging an end of the dielectric body member.

9. A coaxial connector as recited in claim 1 wherein the ferrule encircles, respectively, the tubular section, the outer contact member, the dielectric body member and the center contact member.

10. A coaxial connector as recited in claim 9 wherein the ferrule encircles, respectively, the tubular section, the outer contact member, the dielectric body member and the center contact member.

11. A coaxial connector as recited in claim 9 wherein the conductive body member is formed with an end section engaging an end of the dieletric body member.

12. A coaxial connector as recited in claim 1 wherein the exterior of the outer contact member is provided with a groove in which the tubular section is received, the groove is opposite a raised projection on the outer contact member, and the raised projection engages the dielectric body member.

13. A coaxial connector as recited in claim 12 wherein the conductive body member is formed with an end section engaging an end of the dielectric body member.

14. A coaxial connector, comprising a conductive body member formed with a U-shaped section having an open side, and formed with a split tubular section forming an opening in communication with the open side, and formed with conductive termial sections projecting from the U-shaped section for connection to ground electrical potential, a dielectric body member in the U-shaped section and projecting through the tubular section and projecting from the conductive body member, a conductive center contact member projecting axially of the dielectric body member and through the tubular section for connection with a further electrical connector, a terminal section of the center contact member projecting from the dielectric body member and through the open side of the conductive body member for connection to a source of electrical signal, a conductive outer contact member encircling the protruding dielectric body member and extending into the tubular section, and a conductive ferrule in crimped engagement on the tubular section and covering the split opening of the tubular section.

15. A coaxial connector as recited in claim 14 wherein the dielectric body member as a dielectric opening in the junction of a side and an end of the dielectric body member, the outer body member is formed with an end section engaging the end of the dielectric body member and covers a portion of the dielectric opening in the dielectric body member.

* * * * *